US012731020B2

(12) United States Patent
Terasaki

(10) Patent No.: US 12,731,020 B2
(45) Date of Patent: Sep. 8, 2026

(54) NEUROMORPHIC CIRCUIT, NEUROMORPHIC ARRAY LEARNING METHOD, AND PROGRAM

(71) Applicant: TDK CORPORATION, Tokyo (JP)

(72) Inventor: Yukio Terasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1007 days.

(21) Appl. No.: 17/287,355

(22) PCT Filed: Dec. 20, 2018

(86) PCT No.: PCT/JP2018/046924
§ 371 (c)(1),
(2) Date: Apr. 21, 2021

(87) PCT Pub. No.: WO2020/129204
PCT Pub. Date: Jun. 25, 2020

(65) Prior Publication Data
US 2021/0312272 A1 Oct. 7, 2021

(51) Int. Cl.
*G06N 3/065* (2023.01)
*G06N 3/08* (2023.01)
*G11C 13/00* (2006.01)

(52) U.S. Cl.
CPC ............... *G06N 3/065* (2023.01); *G06N 3/08* (2013.01); *G11C 13/0011* (2013.01); *G11C 13/0069* (2013.01)

(58) Field of Classification Search
CPC ...... G06N 3/08; G06N 3/065; G11C 13/0011; G11C 13/0069
See application file for complete search history.

(56) References Cited

U.S. PATENT DOCUMENTS

| | | | | |
|---|---|---|---|---|
| 9,780,763 | B1 * | 10/2017 | Lu | H03K 5/24 |
| 2015/0269483 | A1 | 9/2015 | Nishitani et al. | |
| 2016/0336064 | A1 * | 11/2016 | Seo | G11C 13/0002 |
| 2017/0064136 | A1 * | 3/2017 | Fujita | H04N 1/3273 |
| 2020/0272891 | A1 | 8/2020 | Terasaki | |

FOREIGN PATENT DOCUMENTS

| | | | |
|---|---|---|---|
| JP | 2015-195011 | A | 11/2015 |
| JP | 6293963 | B1 | 3/2018 |
| WO | 2009/113993 | A1 | 9/2009 |

OTHER PUBLICATIONS

Soudry et al., "Memristor-Based Multilayer Neural Networks With Online Gradient Descent Training," Oct. 2015, IEEE Transactions on Neural Networks and Learning Systems, vol. 26, No. 10, pp. 2408-2421. (Year: 2015).*
Mar. 5, 2019 Search Report issued in International Patent Application No. PCT/JP2018/046924.

* cited by examiner

*Primary Examiner* — Kyle R Stork
(74) *Attorney, Agent, or Firm* — Oliff PLC

(57) ABSTRACT

A control device of an array including neuromorphic elements that multiply a signal by a weight corresponding to a value of a variable characteristic is provided with a control unit which calculates update amounts of element conductances in a neuromorphic array on the basis of weight update amounts from a learning algorithm, and, after applying a write signal for changing conductances in the neuromorphic array, selects certain elements with reference to a predetermined threshold value and applies an additional write signal.

18 Claims, 10 Drawing Sheets

ELEMENT 1
ELEMENT 2
ELEMENT 3
Z LINE
X POINT
Y POINT
ΔG
NUMBER OF WRITE SIGNALS
$G_{max}$
$G_{ideal}[T+1]$
$G'[T+1]$
$G[T]$
$G_{min}$

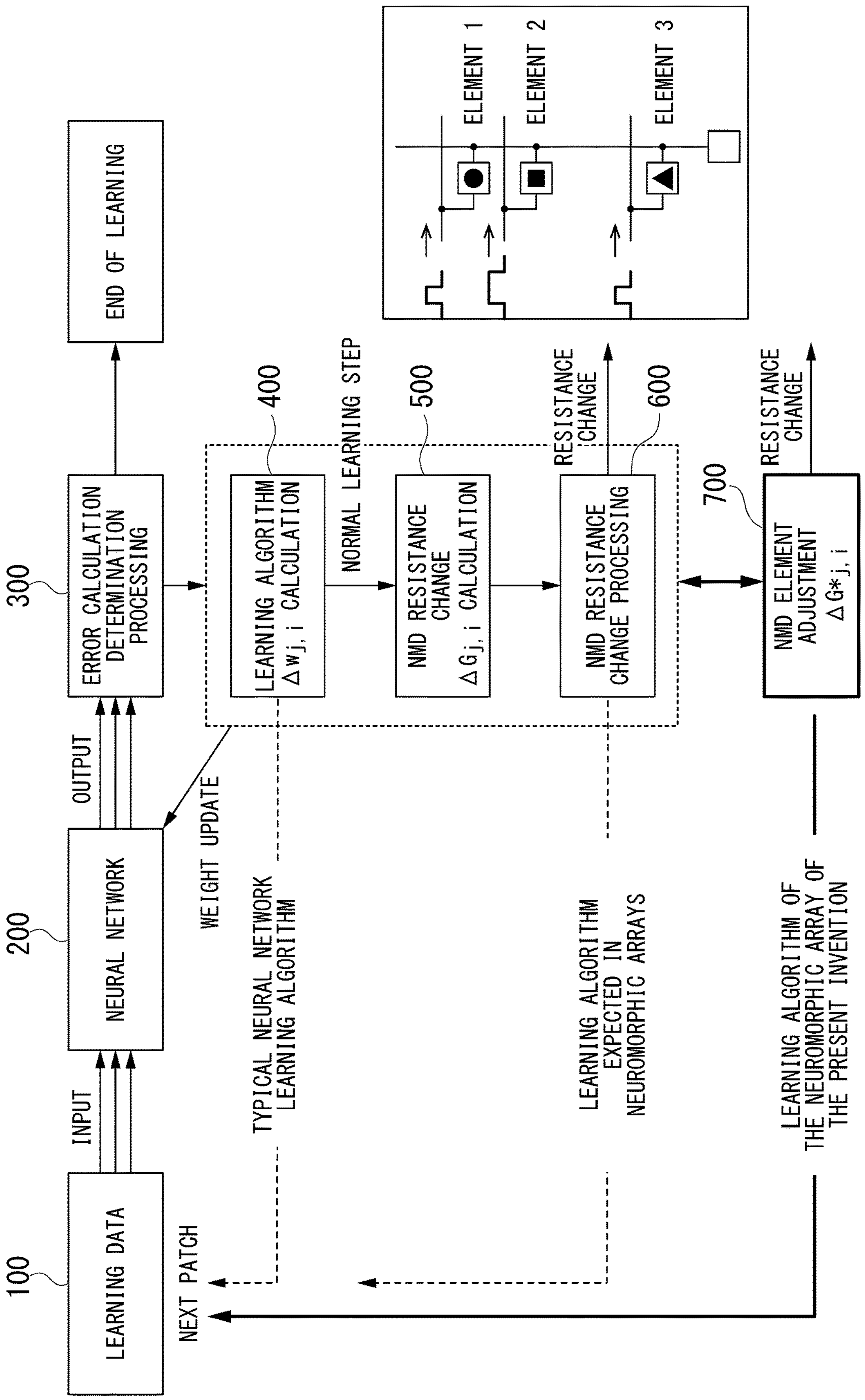

FIG. 5

100 LEARNING DATA

INPUT

200 NEURAL NETWORK

OUTPUT

300 ERROR CALCULATION DETERMINATION PROCESSING

END OF LEARNING

WEIGHT UPDATE

NORMAL LEARNING STEP

400 LEARNING ALGORITHM $\Delta w_{j,i}$ CALCULATION

500 NMD RESISTANCE CHANGE $\Delta G_{j,i}$ CALCULATION

600 NMD RESISTANCE CHANGE PROCESSING

RESISTANCE CHANGE

700 NMD ELEMENT ADJUSTMENT $\Delta G^{*}_{j,i}$

RESISTANCE CHANGE

ELEMENT 1

ELEMENT 2

ELEMENT 3

NEXT PATCH

TYPICAL NEURAL NETWORK LEARNING ALGORITHM

LEARNING ALGORITHM EXPECTED IN NEUROMORPHIC ARRAYS

LEARNING ALGORITHM OF THE NEUROMORPHIC ARRAY OF THE PRESENT INVENTION

1

2

MAXIMUM INPUT VALUE

READ SIGNAL

WRITE SIGNAL

3

311

312

31

32

33

$W_{[1]}$ $W_{[i]}$ $W_{[n]}$

4

5

ERROR SIGNAL

TEACHER SIGNAL

6

61

62

63

64

65

66

DATA SET FOR LEARNING

LEARNING STEP END SIGNAL

NEUROMORPHIC CIRCUIT, NEUROMORPHIC ARRAY LEARNING METHOD, AND PROGRAM

TECHNICAL FIELD

The present invention relates to a control device, a control method, and a program pertaining to weight update of an array including neuromorphic elements.

BACKGROUND ART

Conventionally, neural network technology has been studied.

Advanced information identification techniques and classification techniques using neural network technology including deep learning have been put to practical use over a wide field such as in finance, marketing, authentication, and security. In such techniques, a vast amount of product-sum operation is required and executed using a cloud server or a large computer in many cases.

Recently, a new computing mechanism capable of executing the aforementioned product-sum operations with low power at a high speed using neuromorphic elements that can vary conductance or resistance values in an analog manner has been researched. This is for realizing high-speed signal processing with low power consumption by imitating relations between neurons and synapses in the recognition process of the human brain, and a wide range of research such as a technology for imitating a neural network structure as a static network model, a technology for realizing a firing model of neurons from a timing of a spike signal, and the like is being conducted.

An example of a neuromorphic element in this field will be described. For example, there are an element using a phase change memory (PCM) that controls phase change in crystals and amorphous materials in stages, an element using a conductive bridge RAM (CBRAM) that utilizes formation and extinction of a path between metal deposition and ionization according to an electrochemical reaction, and the like.

In addition, as another example, an element using spintronics is also used. For example, research on a domain wall type element that causes linear change in conductance to occur according to control of a magnetic domain wall or a spin orbit torque (SOT) type element using magnetization reversal according to a spin orbit torque action is being conducted.

Furthermore, as an example of another neuromorphic element, a resistive random access memory (ReRAM) using an oxygen defect density at the interface of a medium such as $TaO_2$ is conceivable.

While neuromorphic elements have been researched, particularly, based on analog hardware that executes a reasoning function, research for executing learning of a neural network which has been performed through operations on a computer conventionally using a neuromorphic array in which a plurality of neuromorphic elements are arranged in an array form has also been started. As an example, Patent Literature 1 discloses a learning method of a neural network system which collectively updates, when conductances of a plurality of elements connected to the same bit line are simultaneously applied to the respective elements, the conductances of the respective elements using a potential difference between an input and an output in a spike type neural network (refer to citation 1).

In learning of a neural network, a method such as a gradient descent method is generally used. The gradient descent method is a method for optimizing weights of a neural net such that outputs of the neural network with respect to input data are finally made consistent with teacher data by repeatedly executing calculation of an amount of change with respect to a synapse weight (hereinafter referred to as a weight) for combining each node of the neural network from differences between outputs and the teacher data. More specifically, weights are updated such that results obtained by partially differentiating differences between outputs of the neural net and the teacher signals with respect to weights of the neural net become 0, as represented by expressions (1) to (5) below.

Expression (1) is calculated to obtain Δw. The first term is represented by expression (2). The second term is represented by expression (3) when an activation function is RELU. The variable v of the third term is a polynomial expression of w, and thus the partial differentiation thereof is represented by expression (4). On the basis of the aforementioned results, Δw is calculated using expression (5) (ρ is a coefficient representing a learning rate).

[Math. 1]

$$\frac{\partial E}{\partial w_{k,l}^{(2)}} = \frac{\partial E}{\partial z_k} \cdot \frac{\partial z_k}{\partial w_{k,l}^{(2)}} = \frac{\partial E}{\partial z_k} \cdot \frac{\partial z_k}{\partial v_k} \cdot \frac{\partial v_k}{\partial w_{k,l}^{(2)}} \tag{1}$$

[Math. 2]

$$\frac{\partial E}{\partial z_k} = \frac{\frac{1}{2}\partial \sum_{i=1}^{r} (z_i - t_i)^2}{\partial z_k} = z_k - t_k \tag{2}$$

[Math. 3]

$$\begin{aligned} z_k &= f_r(v_k) \\ \frac{\partial z}{\partial v_j} &= f_r'(v_k) \\ &= 1(v_k > 0) \end{aligned} \tag{3}$$

[Math. 4]

$$\begin{aligned} v_k &= \sum_{i=0}^{q} w_{k,j}^{(2)}, y_i (k = 1, \ldots , r) \\ \frac{\partial v_k}{\partial w_{k,j}^{(2)}} &= y_i \end{aligned} \tag{4}$$

[Math. 5]

$$w_{k,l}^{(2)} := w_{k,l}^{(2)} - \rho \cdot ((z_k - t_k) \cdot y_i) \tag{5}$$

In a case where this learning algorithm is applied to a neuromorphic array composed of neuromorphic elements, a weight update amount calculated through a neural network is converted into a conductance update amount of the elements. Then, a write signal is applied to the elements in order to provide a change in conductance corresponding to the weight update amount to the elements. However, it is difficult to manufacture elements having completely uniform conductance change in general, and thus an amount of change in conductance may not be correctly reflected in the actual conductance value of the elements. In a case where the number of elements constituting an array is small, it is possible to determine conductances of the elements with high accuracy by measuring a conductance of each element and finely adjusting a conductance value after a write signal is applied. However, this method is not practical because the size of each layer of a neural net is generally 100×100 or more. The method such as collectively rewriting as represented in the preceding example has been proposed in this background.

In this manner, variation in elements may be conceived as a problem when a neural network is implemented using neuromorphic elements. As variation in elements, for example, conductance variation between elements when an array is constructed, read repeatability variation, non-linearity and asymmetry variations of conductance in each step in the same element, and the like are conceivable. Since these variations are not considered in a neural network calculated on a computer, in general, when a neural net is realized using an array of such elements, many problems are generated. Particularly, a learning algorithm having a great effect on identification performance is likely to be seriously affected. For example, problems that identification performance deteriorates because elements do not reflect correct weights, a time is taken until learning convergence in execution of a learning algorithm, the learning algorithm does not converge, and the like are generated.

While there is a method of correcting static variation having high repeatability using a method of allocating weights of a neural network to conductances, or the like, it is difficult to avoid dynamic variation, that is, change in units of one conductance change operation, using such a method. Regarding this phenomenon, in a filament formation type element (CBRAM) and the like, for example, there may be a state in which a filament formation state remains near a boundary with a conductance state of the next step because interatomic potentials have discrete values for an electric field energy applied for resistance change. In addition, in an application example using a magnetoresistance change element, a phenomenon in which a magnetic domain wall stops at a position in front of a magnetic domain wall position target to which the magnetic domain wall was originally intended to be moved due to trap sites generated according to magnetic potential change in a magnetic film, and the conductance deviates from a target value to which it was originally intended to change, and the like occur.

As described above, even if a write signal according to an expected amount of change in conductance calculated from a weight update amount and an amount of change in conductance (discrete step) of elements is applied to the elements, a learning algorithm changes from an expected conductance value because the elements have conductance variation. As a result, although elements are inherently required to have the same conductance value at the same step position within a range of change in conductance, actual conductances of the elements have variation. That is, conductance values deviate from a conductance target value calculated from the algorithm. This has an adverse influence on mechanisms such as convergence of the learning algorithm, the operation of optimization processing called an optimizer, and regularization processing for avoiding a local optimal solution risk. In the worst case, phenomena such as failure, divergence, and the like of the learning algorithm occur. The present invention is devised in view of these circumstances.

CITATION LIST

Patent Literature

[Patent Literature 1]
Japanese Unexamined Patent Application, First Publication No. 2015-195011

[Patent Literature 2]
Japanese Patent No. 6293963

SUMMARY OF INVENTION

Technical Problem

In a case where a learning algorithm of a neural network is executed using a neuromorphic array composed of neuromorphic elements, there is a problem that the learning performance deteriorates and the learning algorithm itself may not work due to element variation or change in the neuromorphic elements. Furthermore, a learning method, optimization control, and the like with respect to a neural network on the assumption of practically manufactured neuromorphic elements have not been sufficiently examined yet.

An object of the present invention devised in view of such circumstances is to provide a control device of an array including neuromorphic elements capable of efficiently and stably executing a learning algorithm of a neural network according to a neuromorphic array, a method for changing conductances of elements, and a program.

Solution to Problem

One aspect of the present invention is a neuromorphic circuit having two or more variable resistance elements capable of having variable resistance values and connected to a common bit line, the neuromorphic circuit including: an input signal generation circuit configured to generate an input signal from input data and apply the input signal to the variable resistance elements; a detection circuit configured to detect a current flowing through the common bit line; a differential circuit configured to output a difference between a teacher signal corresponding to the input data and an output of the detection circuit; a learning control circuit configured to execute a learning algorithm of a neural network and convert a weight update amount into an amount of change in conductance of each element; a write signal generation circuit configured to generate a signal for changing conductances of the variable resistance elements by an amount calculated by the learning control circuit; and a selection circuit configured to select certain variable resistance elements according to predetermined selection conditions, the neuromorphic circuit including a determination mechanism which, after applying a write signal based on an amount of change in conductance and then applying an additional write signal to the certain elements selected by the selection circuit, is configured to re-input the input signal to all variable elements and determine whether to continue or stop learning from change in the difference between the output of the detection circuit and the teacher signal.

In one aspect of the present invention, the selection conditions in the selection circuit include selection according to a threshold value calculated on a basis of absolute values of weight update amounts.

In one aspect of the present invention, the selection conditions in the selection circuit include selection according to a threshold value calculated on a basis of an absolute value of the input data.

In one aspect of the present invention, the threshold value is determined such that elements are selected at a fixed ratio with respect to a total number of elements connected to the common bit line.

In one aspect of the present invention, the threshold value is changed in accordance with progress of learning.

In one aspect of the present invention, two or more common bit lines disposed in a first direction are provided, a plurality of variable resistance elements disposed at a same positions on the plurality of common bit lines from an edge are connected through word lines arranged in a second direction different from the direction of the common bit lines, and the selection circuit is configured to sequentially perform additional write signal applying processing for the respective common bit lines.

In one aspect of the present invention, the threshold value is set differently for the common bit lines.

In one aspect of the present invention, after applying the additional write signal, the determination mechanism is configured to further apply an additional write signal if a difference change amount is positive; and further apply a write signal for changing resistance in a reverse direction if the difference change amount is negative.

One aspect of the present invention is a neuromorphic array learning method, in a neuromorphic array composed of a plurality of variable resistance elements, including the steps of: performing learning of a neural network; converting a weight update amount of the neural network into an amount of change in conductance of each variable resistance element of the neuromorphic array; applying a write signal based on the converted amount of change in conductance to the neuromorphic array; selecting a portion of the elements; applying an additional write signal only to the selected elements; and re-inputting learning data to the neuromorphic array and determining end of a corresponding learning cycle using a difference from a teacher signal of the learning data.

One aspect of the present invention is a program for causing a computer to execute, in a neuromorphic array including neuromorphic elements that multiply a signal by a weight corresponding to a variable characteristic: the steps of: performing learning of a neural network; converting a weight update amount of the neural network into an amount of change in conductance of a neuromorphic array element; applying a write signal based on the converted amount of change in conductance to the neuromorphic array; selecting a portion of the elements; applying an additional write signal only to the selected elements; and re-inputting learning data to the neuromorphic array and determining end of a corresponding learning cycle using a difference from a teacher signal of the learning data.

Advantageous Effects

According to the present invention, it is possible to stably execute a learning algorithm calculated through a computer in a case where learning of a neural network system is performed using a neuromorphic array.

In addition, according to the present invention, it is possible to cause a learning algorithm to rapidly converge in a neural network using a neuromorphic array.

Furthermore, according to the present invention, it is possible to improve identification performance in a neural network using a neuromorphic array.

BRIEF DESCRIPTION OF DRAWINGS

FIG. 5 illustrates a neuromorphic array learning method using neuromorphic elements according to the present invention.

DESCRIPTION OF EMBODIMENT

[Conductance Change in Neuromorphic Element]

Figure 1:
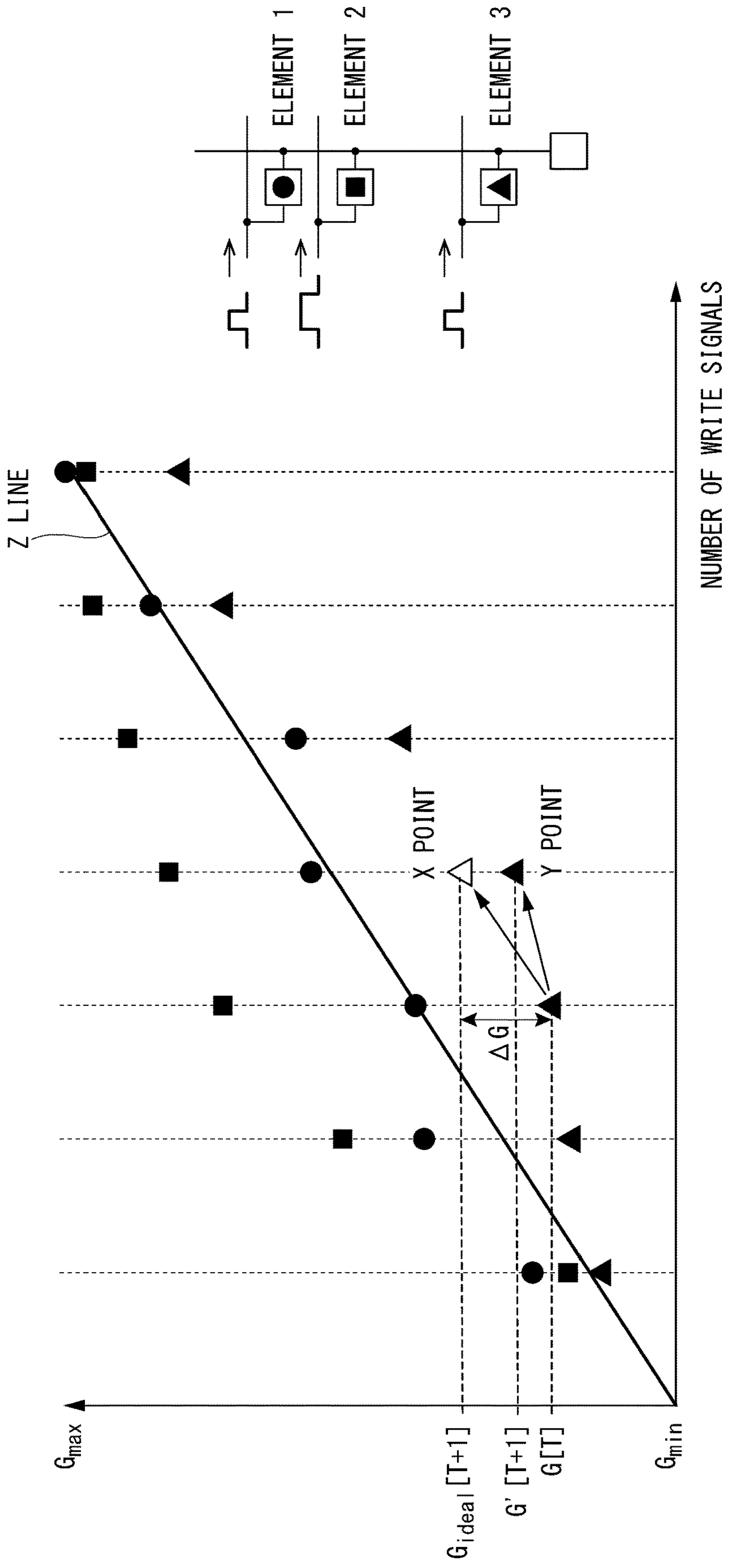
FIG. 1 is a diagram schematically representing conductance changes in neuromorphic elements constituting a neuromorphic array according to an embodiment of the present invention.

FIG. 1 illustrates variation in conductance changes in neuromorphic elements. FIG. 1 illustrates that divergence in weight update values is generated because element characteristics are not ideal. In a case where neuromorphic elements are used as product-sum operators of a neural network, change characteristics as represented by ideal linear change (Z line) in the figure are desirable as conductance change characteristics of each element. However, in practically manufactured elements, changes depending on various variations in elements and processes may occur. In addition, there are cases in which non-linear conductance change is principally represented according to a physical phenomenon used as a conductance change mechanism of elements. Actual conductance change in elements based on such change may represent conductance changes in element 1, element 2, and element 3 in the figure, for example.

Problems will be described on the assumption that elements having such characteristics are used. It is assumed that the conductance of element 3 at a time T has a value G[T] in the figure. In this state, it is conceivable that an amount of change in conductance is calculated from a weight update amount calculated through a learning algorithm such as a gradient descent method or the like and the conductance of the element changes to an expected conductance value (outlined triangle (X point)). A write signal for causing conductance change is applied, and thus the conductance of the element changes to a value of "actual element conductance (Y point)" in the figure. Thereafter, the next learning cycle is executed, learning data is input to the array, and the output of the array is compared with a teacher signal. If the learning algorithm operates ideally, a difference between the output and the teacher signal decreases. However, in the case of a neuromorphic array manufactured using a practical process, calculated amounts of change in conductance are not correctly reflected in elements and the elements have conductances of G'[T] to bring about a phenomenon in which the learning algorithm diverges instead of converging in an expected direction or convergence deteriorates, or the like in a learning cycle executed after this.

Influences of such variation in elements on a learning algorithm will be described through simulations.

Figure 2:
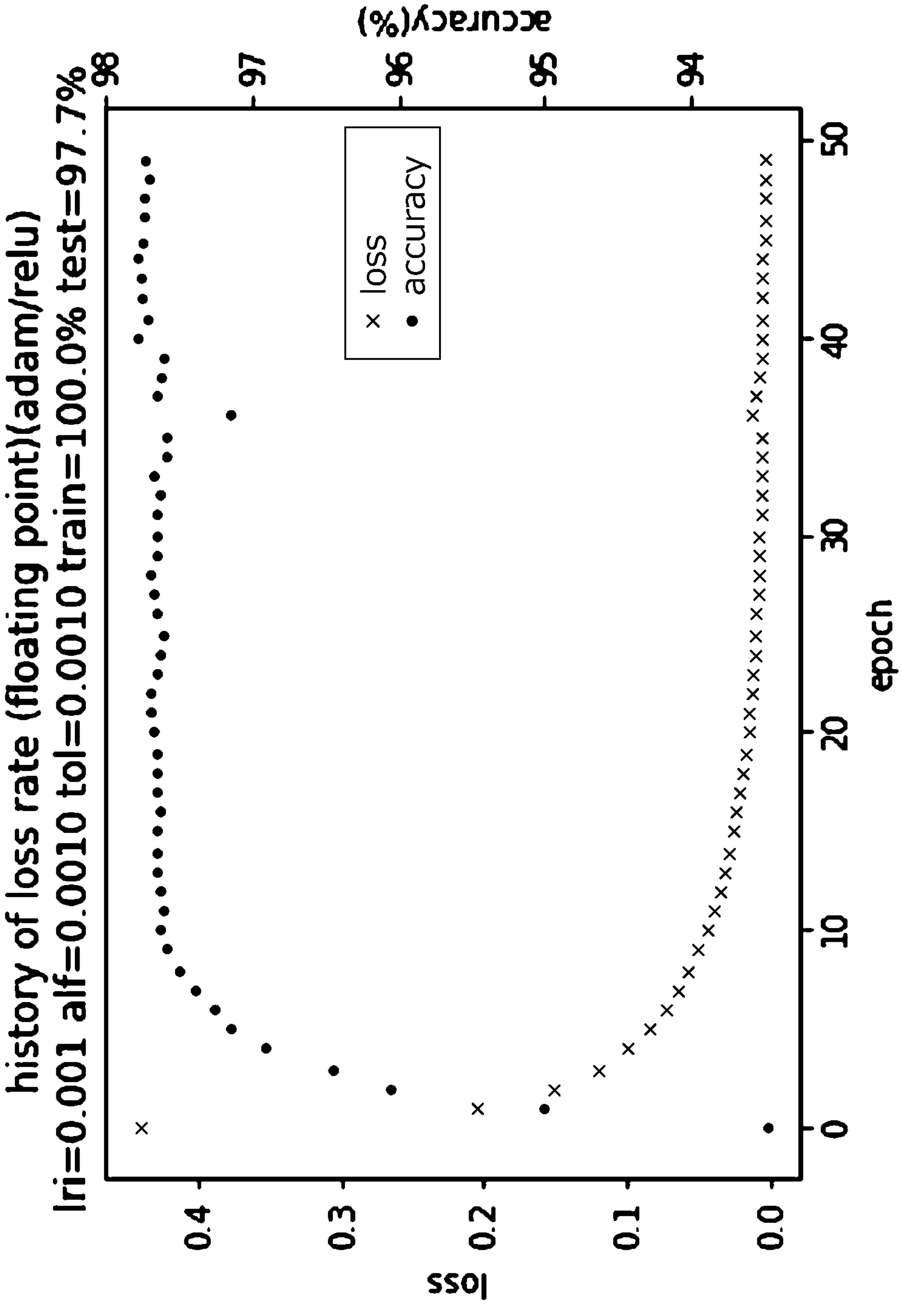
FIG. 2 is a diagram illustrating results of transition calculation of the output of a loss function and transition of change in identification performance in accordance with progress of learning through computer simulations with respect to a neural network according to an embodiment of the present invention.

A learning state in a neural network for identifying handwritten digits is represented. The neural network is assumed to be an MLP in a three-layer structure in which the first layer is composed of neurons of 784 dimensions, the second layer is composed of neurons of 100 dimensions, and the third layer is composed of neurons of 10 dimensions. FIG. 2 illustrates transition of convergence of learning performance in a case where weights have been calculated through a floating point operation. FIG. 2 illustrates transition of the output of an error function (loss) and an identification rate (accuracy) with respect to progress of the epoch according to execution of a learning algorithm through the gradient descent method on a computer in this neural network. In this manner, a convergence trend in which the output of the error function decreases and identification performance gradually increases in accordance with progress of learning is shown. In application, a general implementation method on a computer is setting a threshold value on the basis of any criterion according to error function output values, a difference thereof, an identification rate, or the like and performing determination of ending. Meanwhile, although the three-layer MLP is described here, various neural network layer configurations and mechanisms have been proposed in practical applications. For example, networks with layer structures exceeding 20 layers may also be used, and there is a wide range of applications of natural language processing such as general object detection and identification, and emotion analysis, and the like.

Figure 3:
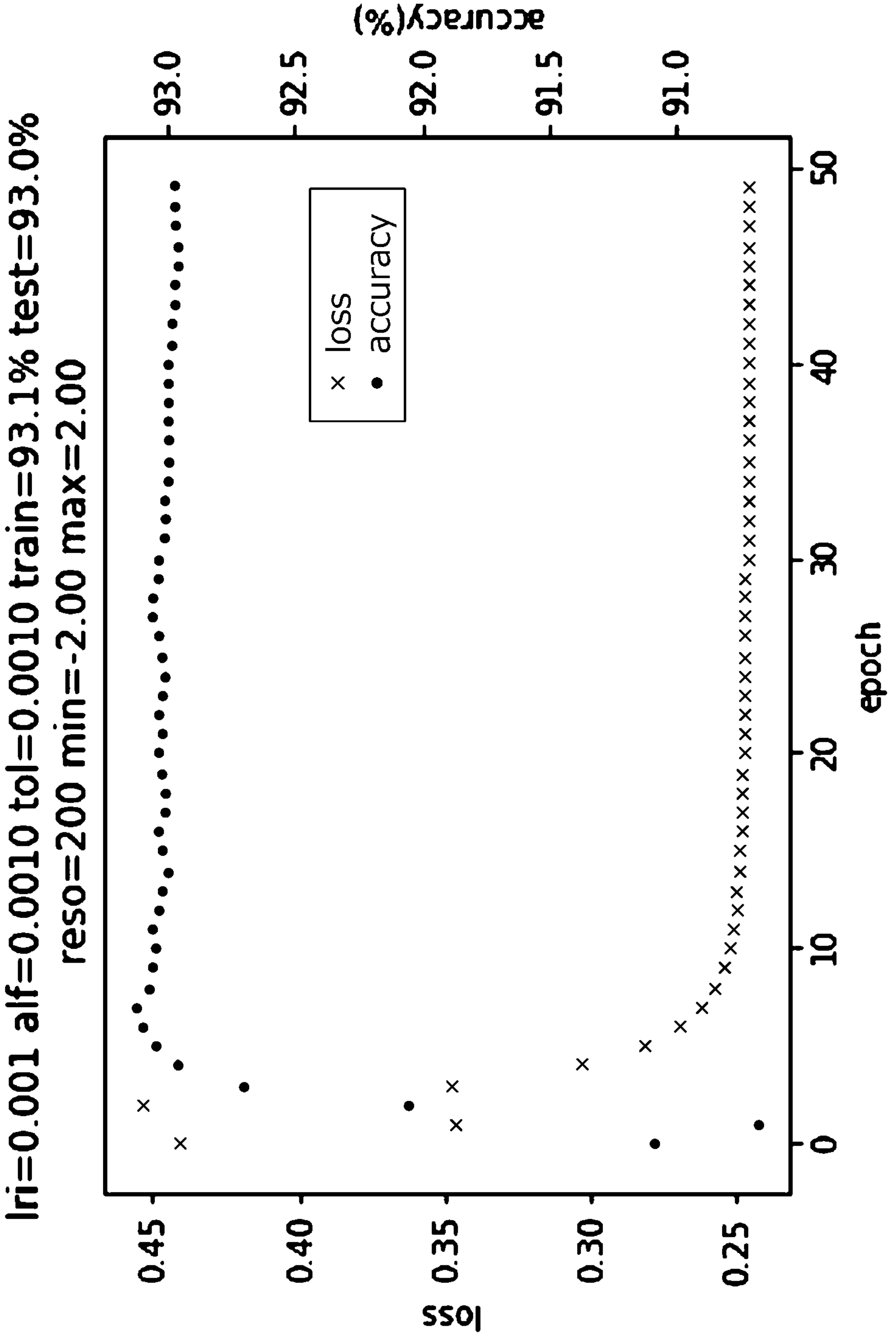
FIG. 3 is a diagram illustrating simulation results representing the output of a loss function and transition of change in identification performance in accordance with progress of learning in a case where learning has been performed using a neuromorphic array having ideal characteristics with respect to a neural network according to an embodiment of the present invention.

FIG. 3 illustrates transition of learning in a case where this neural network is realized using an array of neuromorphic elements having ideal conductance change, that is, linear conductance change due to a constant discrete step width. Here, the expression "ideal" is based on the assumption that each element of the neuromorphic array provides a uniform finite discrete step width and all elements have the same linear conductance change without consideration of causes of variation in elements. If characteristics of neuromorphic elements are ideal in this manner, it is expected that, even if elements have a conductance discretization characteristic, a learning algorithm is not greatly affected thereby and will converge normally. As disclosed in Patent Literature 2, a learning algorithm having no practical problem can be executed if variation in elements and a weight allocation method are suitable.

Figure 4:
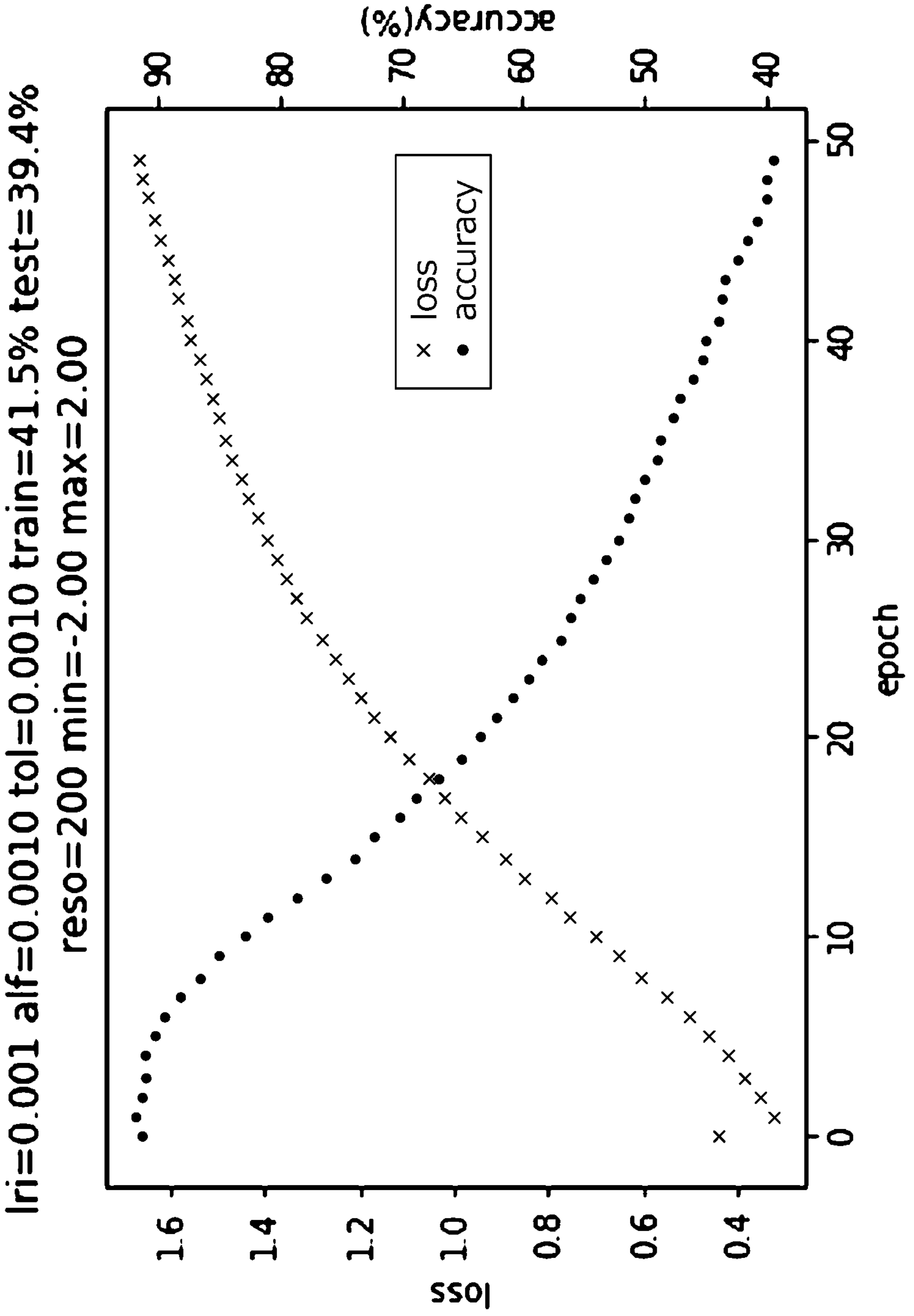
FIG. 4 is a diagram illustrating simulation results representing the output of a loss function and transition of change in identification performance in accordance with progress of learning in a case where learning has been performed using a neuromorphic array in consideration of variation in neuromorphic elements.

Meanwhile, FIG. 4 illustrates results considering variation in neuromorphic elements. It is assumed that the conductance of each neuromorphic element is changed based on a probability distribution of about 1% to cause independent change in each learning algorithm execution. As ascertained from these results, the influence of change in elements on the learning algorithm is considerable and a convergence algorithm itself fails in this case. Although this simulation results do not necessarily have universal implication because actual elements have stochastically generated change or fixed offset change due to the shape of each element according to a change mechanism, it may be conceived that the same operation of the learning algorithm as calculation results on a computer is not guaranteed in actual elements considering variation in element characteristics in addition to element-specific discrete values because the learning algorithm is created and verified in a floating point format having a sufficient operation word length. Rather, it is easily supposed that increase in the number of learning operations and vibration until convergence are brought about as represented in this simulation. The present invention is devised on the basis of this background technology.

[Overview of Learning of Neuromorphic Elements]

FIG. 5 conceptually illustrates a neuromorphic array learning method using neuromorphic elements according to the present invention. Learning data 100 is input to a neural network 200, differences (loss) between outputs of the neural network 200 and teacher data (not illustrated) are calculated through error calculation determination processing 300, and end of a learning algorithm is determined. In a case where the learning algorithm is not ended, weight update amounts for minimizing error are obtained through the learning algorithm 400. Conventionally, weights of the neural network 200 are changed on the basis of the obtained weight update amounts. Further, conductances of elements of the neuromorphic array are converted from the weight update amounts to amounts of change in conductance in a step of NMD resistance change calculation 500, and a write signal is applied to actual elements constituting the neuromorphic array in NMD resistance change processing 600. The present invention is characterized in that NMD element adjustment step 700 is provided after the aforementioned steps to adjust conductance values of certain elements.

The learning algorithm is realized by a method of acquiring learning data in units called batches, inputting the learning data to the neuromorphic array, comparing outputs of the neuromorphic array with teacher data corresponding to the learning data, and adjusting the conductance of each element of the neuromorphic array such that a cumulative error is minimized. Learning is controlled in such a manner that a learning cycle is continued if the cumulative error is equal to or greater than a preset threshold value and learning is ended when the cumulative error becomes equal to or less than the threshold value while a cycle from learning data input to conductance update is repeated.

As a learning algorithm, for example, there is the gradient descent method or the like. This is a method of calculating an amount of change for each weight by partially differentiating a difference (loss) from a teacher signal with respect to each weight between layers. This calculation algorithm can perform calculation in units of layer retrospectively from an output layer to an input layer for a neural network having a multi-layer structure with two or more layers and can also update all weights of the multi-layer neural network. This is called error back propagation which is a calculation method used in a neural network executed through a general computer or the like.

In addition, as another learning method, there is spike timing dependency plasticity (STDP) learning. This imitates a mechanism of updating a connection degree of synaptic connection of the human brain differently from the gradient descent method that is a convergence algorithm using differentiation. Synaptic connection is realized by a resistance change type element disposed between a preceding neuron (pre-neuron) and a following neuron (post-neuron) and generates a potential difference in synaptic-connected elements in a certain period using a time difference between firing timings of preceding and following neurons to increase or decrease conductance. When conductance decreases, it is difficult for a signal of a preceding neuron to be propagated to the following neuron and activity of the following neuron deteriorates. On the other hand, when conductance increases, a signal of a preceding neuron is easily propagated to the following neuron and excitation easily occurs for an input signal. That is, this is a learning method of modeling an excited state of neurons.

In any case, it is necessary to perform optimization for a problem targeting conductance values of elements corresponding weights in a neural network using a neuromorphic array. In "NMD conductance change ΔG calculation" in FIG. 5, an amount of change in conductance corresponding to a weight update amount is calculated on the basis of a weight update amount obtained from calculation and parameters such as a resolution and a range of weights allocated to elements. An allocation method with respect to such weights and a conductance range of elements, or the like is described in detail in Patent Literature 2.

In "NMD conductance change processing," a write signal corresponding to an amount of change in conductance is generated. As a simple method, a method of calculating a multiple of a basic amount of change in conductance according to a write signal, which corresponds to a calculated amount of change in conductance, applying as many write signals as the multiple, and the like may be conceived. This write signal is applied to the neuromorphic array to change conductances of elements, and the next learning cycle is repeated.

The present invention provides a function for curbing the influence of change caused by element variation and the like after the aforementioned conventional conductance update processing is performed. When this function is incorporated in a learning cycle, the influence of accuracy variation in conductance of the entire neuromorphic array is curbed, and thus it is possible to achieve convergence stabilization and high speed of the learning algorithm. Hereinafter, the adjustment function will be described.

[Adjustment Function]

As described above, it is difficult to correctly reflect a weight update amount calculated through the floating point operation or the like due to causes of change such as repeatability variation in the neuromorphic array. Accordingly, the present invention discloses the following processing performed after the aforementioned writing for conductance change in neuromorphic elements is performed. Except for a method such as drop-out, all weights of a target layer become targets of update calculation in conventional learning algorithms as long as a calculation resolution does not become equal to or less than a calculation resolution caused by an operation word length. Meanwhile, since a conductance value of a neuromorphic element is subjected to a discrete step, a conductance update amount of the element becomes 0 in the case of an update amount equal to or less than a certain value. A write signal is applied to elements other than elements having a conductance update amount of 0. After this write signal for update is applied, elements consistent with specific conditions are selected from elements and an additional write signal is applied to the selected elements through the adjustment function. Here, the specific conditions are mentioned because, even when the adjustment function is not applied to all elements, the learning algorithm is not affected thereby.

The conductance of an element changes due to additional writing. Thereafter, the learning data is re-input to the neuromorphic array and differences between outputs of the neuromorphic array and the teacher signal are compared with differences before execution of the adjustment function. Determination of whether to further additionally apply a write signal to the selected elements or apply a write signal for causing (negative) conductance change in a reverse direction is performed depending on a comparison result. In this manner, learning performance of an identifier can be improved by extracting certain elements from elements updated through the learning algorithm and additionally changing conductance values thereof.

As element selection conditions in the adjustment function, pre-setting a threshold value for absolute values of weight update amount, conductances, amounts of change in resistance, and the like and selecting elements to be updated to values exceeding the threshold value, or the like may be conceived. Furthermore, a method of setting fixed proportions for the number of all elements constituting the neuromorphic array in descending order of update amounts and performing the same adjustment function on elements corresponding the number of proportions may also be conceived. Sufficient effect of the adjustment function can be obtained only by executing the adjustment function on 10% or less of all elements. Furthermore, a method for changing the proportions and the threshold value in accordance with batch progress of learning may also be employed.

Moreover, with respect to the additional write signal used in the adjustment function, application of a write signal that causes conductance change less than that caused by a write signal in a conventional learning cycle may be conceived. For example, a method of using a voltage lower than a voltage used for conventional rewriting in the case of an element for which an amount of change in conductance is determined depending on a voltage, or decreasing a pulse length in the case of an element using constant-voltage pulse width modulation for writing, or the like may be conceived. In the adjustment function, the effects of this element adjustment mechanism are expected even when conductance change less than a minimum amount of change in conductance of a conventional learning process is caused to occur.

Description of Embodiment

An embodiment of the present invention will be described.

[Overview of Neural Network System Using Neuromorphic Array]

Figure 6:
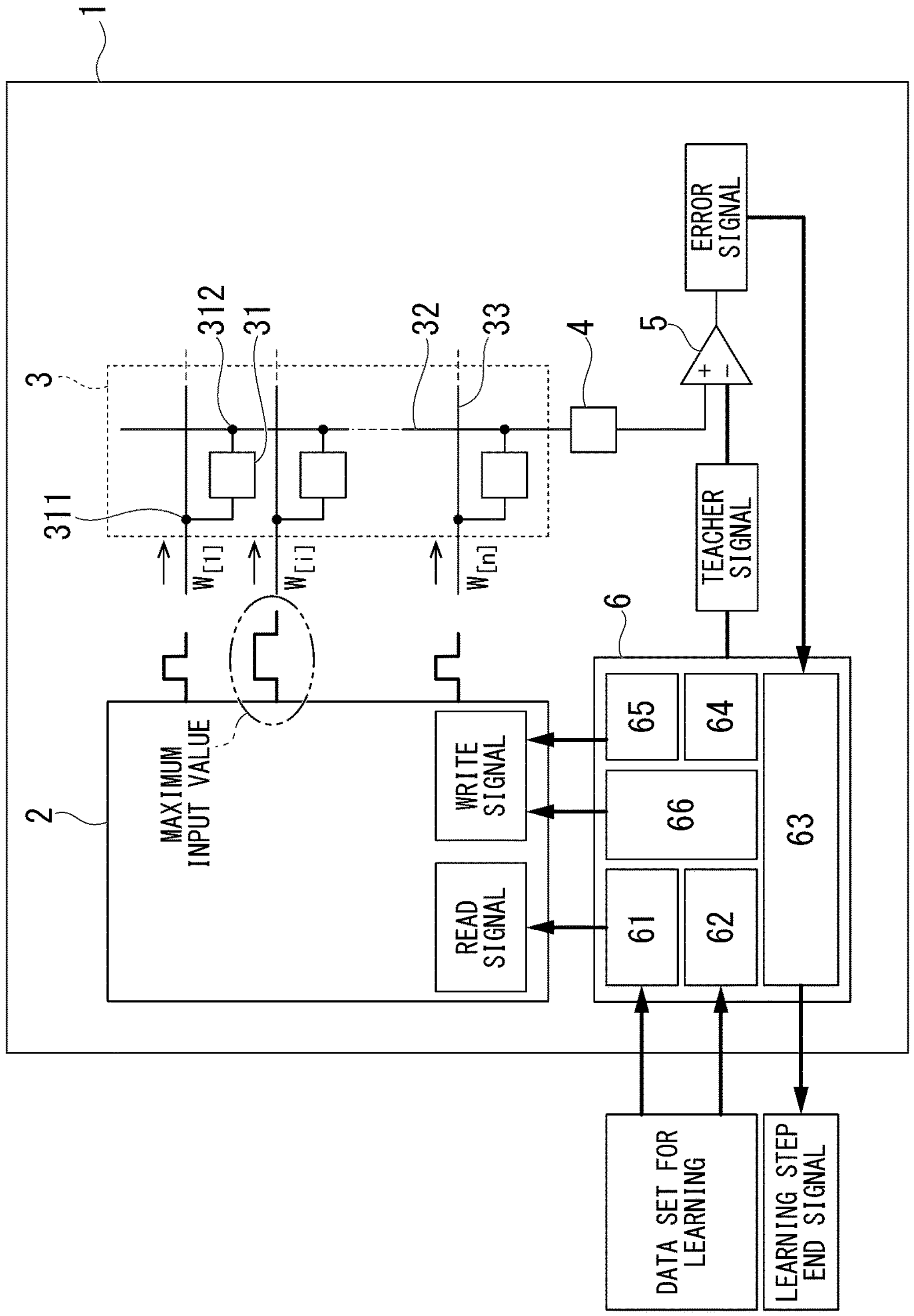
FIG. 6 is a block diagram illustrating a schematic configuration of a neural network system 1 according to an embodiment of the present invention.

FIG. 6 is a block diagram illustrating a schematic configuration of a neural network system 1 according to an embodiment of the present invention.

The neural network system 1 includes a signal generation circuit 2, a neuromorphic array 3, a detection circuit 4, a differential circuit 5, and a learning control circuit 6. The signal generation circuit 2 is a buffer circuit that generates a signal applied to the neuromorphic array 3. The neuromorphic array 3 serves as an analog product-sum operator in the neural network system 1 and includes two or more neuromorphic elements 31, a common bit line 32, and word lines 33. Each neuromorphic element 31 further includes an input terminal 311 and a common terminal 312. The detection circuit 4 is a circuit that detects a total charge amount from the output from the neuromorphic array 3 and converts the total charge amount into a voltage. The differential circuit 5 is a circuit that outputs an error signal that is a difference between the output of the detection circuit 4 and a teacher signal. The learning control circuit 6 is a circuit that controls learning for appropriately controlling the conductance of each neuromorphic element 31 of the neuromorphic array 3 and includes a learning signal generation unit 61 that receives a learning and verification data set from a data set for learning and converts the learning and verification data set into a read signal, a teacher signal generation unit 62 that generates a teacher signal from the data set for learning, a learning determination unit 63 that receives the error signal and determines whether a learning step is continued or a write signal is additionally generated, a conductance update amount calculation unit 64 that calculates weights of a network from the error signal and converts the weights into amounts of change in conductance, a write signal generation unit 65 for causing the calculated conductance update amounts, and an additional write signal generation unit 66 that receives an additional write signal generation instruction from the learning determination unit and generates an additional write signal.

The signal generation circuit 2 is a buffer circuit that generates an application signal for the neuromorphic array 3. The application signal includes both a signal for reading conductance and a write signal for changing conductance. Meanwhile, it is assumed that the neuromorphic element 31 exemplified here is a 2-terminal type element which performs reading and writing using the same two terminals. In the case of a 2-terminal type element, voltages applied for reading and writing are varied such that a voltage at the time of reading is generally set such that no resistance change occurs or an amount of change falls within a predetermined criterion.

A voltage of about 0.2 V is applied, for example, when conductances of neuromorphic elements are read in an inference operation or the like, and a write signal of about 1 V is applied when conductances of elements are changed in a learning operation.

Meanwhile, when an input signal is caused to have meaning exceeding 2 values in an inference operation, a modulation signal for representing each value is used. Here, a pulse width modulation circuit (a voltage is 0.2 V) using an input counter circuit (not illustrated) is assumed, and pulse width modulation (PWM) with 256 gradations of 0 to 2550 ns having 10 ns as a unit is described.

[Learning Data]

Figure 7:
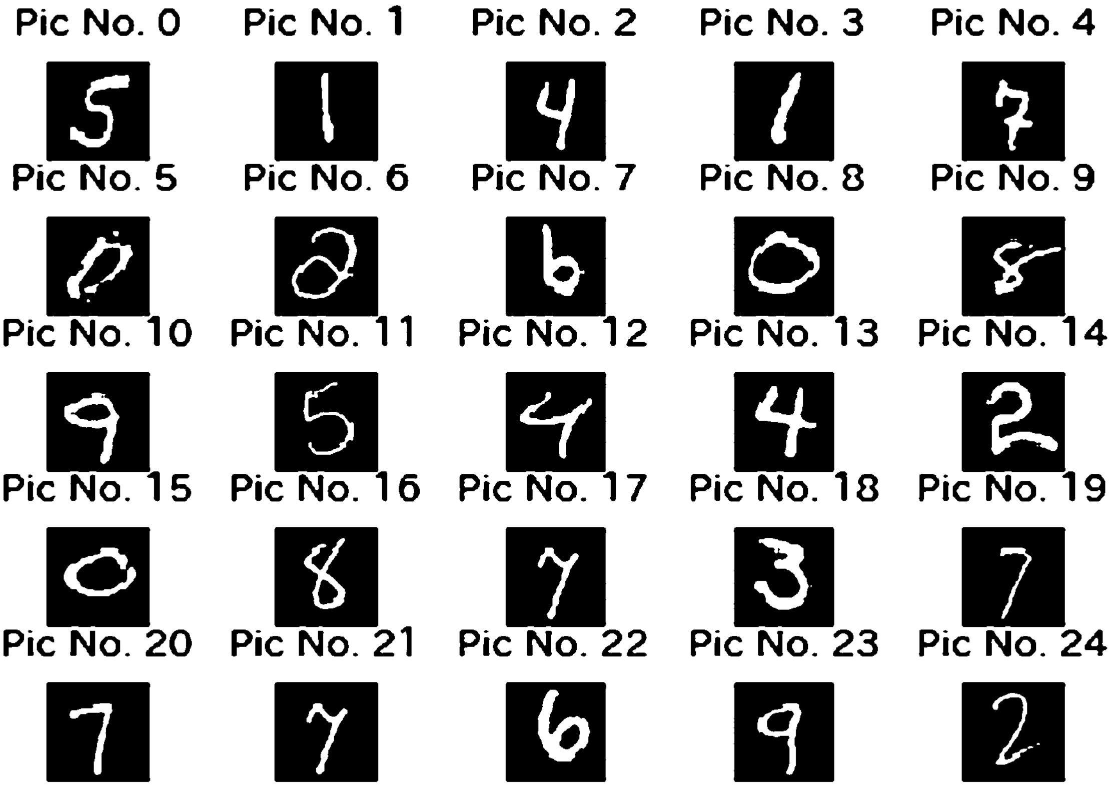
FIG. 7 illustrates an example of an identification target image according to an embodiment of the present invention.

A data set for learning used in the present embodiment will be described. FIG. 7 illustrates an example of 25 images of identification targets according to an embodiment of the present invention. For example, Pic No. 0 is a handwriting pattern image when a digit "5" has been handwritten. Likewise, Pic No. 2 to Pic. No. 5 are handwriting pattern images when digits "4," "1," "7," and "0" have been handwritten. Each pattern is composed of data of 28 pixels× 28 pixels, a total of 784 pixels, and data of each pixel is input to the learning signal generation unit 61 in a format normalized to a range of 0 to 1. Meanwhile, a value of 0 to 9 that is each correct answer corresponding to each handwriting image signal is input to the teacher signal generation unit 62 as teacher data. Since the neural network of the present embodiment is a neural network for identifying whether an input handwriting pattern image is the digit "5," a value finally output from the teacher signal generation unit 62 to the differential circuit 5 is 1 if a correct answer value if "5" and 0 if not.

[Neuromorphic Array]

The neuromorphic array 3 of the present embodiment is composed of a plurality of elements connected to the common bit line 32. Each neuromorphic element 31 is described as a 2-terminal type element having the input terminal 311 and the common terminal 312. The input terminal 311 is connected to the signal generation circuit 2, and an input signal according to a predetermined modulation method is applied thereto at the time of verification performed in inference or learning using the neuromorphic array 3. In addition, in conductance change according to a learning algorithm, a write signal is applied to the input terminal 311 to change the conductance of the neuromorphic element 31. The common terminal 312 is a path through which current flows when an input signal has been applied at the time of inference or learning. In addition, currents of a plurality of connected elements are summed in the common bit line at the time of inference. The common terminal 312 is used as a path of write current at the time of writing. A method of applying a write signal through the common terminal 312 at the time of learning as represented in a known example may also be employed. In the present embodiment, a signal obtained by pulse-width-modulating input data is applied across the input terminal 311 and the common terminal 312 at the time of reading and rectangular waves with a fixed pulse width are applied as a write signal across the input terminal 311 and the common terminal 312 at the time of writing. Meanwhile, the number of rectangular waves for writing is not limited to 1.

Each neuromorphic element 31 executes multiplication corresponding to 1 pixel of an input image. That is, since data corresponding to 784 pixels is an input signal in the present embodiment, 784 neuromorphic elements 31 are connected to the common bit line 32 in parallel.

[Learning Step]

Information on each pixel that is learning data is converted into a pulse width modulation signal (waveform represented by w[1] to w[n] in the figure) in the range of 10 ns to 2560 ns by the signal generation circuit 2 and then applied to the input terminal 311 of each element 31 of the neuromorphic array 3. A current value obtained by multiplying conductance by a voltage flows through the element 31 for a period of a pulse width. The sum of amounts of current flowing through all elements connected by the common bit line 32 is detected by the detection circuit 4 as a charge amount. Since the sum of amounts of current flowing through the common bit line 32 for a time corresponding to a maximum pulse length, that is, a period of 2550 ns in this example, becomes a product-sum operation result in principle, the detection circuit 4 converts these charges into a voltage using a circuit such as a QV conversion circuit. Meanwhile, the QV conversion circuit need not necessarily be used as a charge amount detection method and other methods may also be employed.

The differential circuit 5 outputs a differential signal between a voltage value output from the detection circuit 4 and a teacher signal as an error signal. In the present embodiment, since the output of the common bit line 32 is converted into a voltage value by the detection circuit 4, the teacher signal needs to also be converted into a voltage value. In general (not illustrated), a dynamic range of a circuit assumed to be a QV conversion circuit is assumed and a voltage for which 1 and 0 are respectively allocated to an upper value and a lower value thereof is input to the differential circuit 5 as a teacher signal. Above all, in a case where the output of the common bit line 32 is converted into a digital signal through an ADC circuit or the like, a teacher signal can be realized by the value of the digital signal as it is or by adding a simple operation thereto, and thus the differential circuit 5 can calculate the teacher signal through simple digital differential processing. Here, a teacher signal represents a correct answer determination value for input data. Since it is identified whether input handwritten digit data is "5" in the present embodiment, teacher signal is a voltage value corresponding to 1 if an input handwritten digit image is "5" and a voltage value corresponding to 0 if not.

The learning determination unit 63 in the learning control circuit 6 is a mechanism for converting an error signal that is the output of the differential circuit 5 into a digital value and a circuit for calculating weight update amounts according to a learning algorithm. In a case where the error signal from the differential circuit 5 is less than a threshold value set in advance, the corresponding learning cycle is ended and the process proceeds to the next learning cycle. Learning itself may be ended in the corresponding learning cycle. In a case where the learning cycle is continued, weight update amounts of the neural network system are calculated by additionally using the gradient descent method or the like (expressions (1) to (5)). In the present embodiment, weight update amounts are calculated such that the output of the common bit line 32 has a value of 0 or 1. This calculation is generally performed through digital calculation.

After update amounts for all weights are calculated, the conductance update amount calculation unit 64 calculates a conductance update amount of each element corresponding to a weight update amount. As described above, a conductance update amount is calculated based on a conductance change range and resolution of elements and a method of allocating weights to conductances. A conductance update amount may become 0 according to a calculation result.

The write signal generation unit 65 calculates original data of a write signal necessary to cause conductance change calculated by the conductance update amount calculation unit 64. In the present embodiment, since conductances of the neuromorphic elements 31 linearly change for the number of pulses of the write signal, the original data of the write signal becomes a value corresponding to the number of pulses applied. In a case where a writing method is a pulse width or a voltage applied to the neuromorphic elements 31, a write original signal such as a pulse length or a voltage according to elements is generated. The write signal is applied by the signal generation circuit 2 to the input terminal 311 of each neuromorphic element 31 as a desired signal. Accordingly, each neuromorphic element 31 theoretically changes to a conductance value obtained through the learning algorithm. The learning step in a case where a learning algorithm of a conventional neural network system is applied to the neuromorphic array has been described.

Next, a step of executing the adjustment function according to the present invention which is performed subsequently to the aforementioned step will be described.

[Element Adjustment Step]

After the write signal is applied to each neuromorphic element 31 according to the above-described learning step, an element having a maximum absolute value of a weight update amount calculated by the learning determination unit 63 is selected. In the element adjustment step, the additional write signal generation unit 66 generates an additional write signal only for the selected element. The additional write signal is a signal causing change in a minimum unit in amounts of change in conductance used in the conventional learning step. As a result, a write signal exceeding a weigh update amount calculated by the learning algorithm is applied to the selected element. Thereafter, the learning determination unit 63 re-inputs learning data of the present learning cycle to the neuromorphic array 3, and a difference between the output of the neuromorphic array 3 and teacher data is obtained by the differential circuit 5. In a case where this difference has decreased from that of the previous learning cycle, the aforementioned process is repeated. In a case where the difference has increased or does not change from the previous one, control such as stopping the element adjustment step is performed. In a case where the element adjustment step is performed on a plurality of elements, this process is repeatedly performed by the number of elements which will be adjusted.

A neural network conceived from the mechanism of the human brain functions by converting a target problem into a multi-dimensional non-linear space. The function is realized by projecting input information onto the non-linear space and learning weights of the network such that the input information is consistent with an expected output. Accordingly, in addition to the accuracy of conductance values of individual elements, it is very important to determine whether the state of the entire system has been optimized (minimized) in view of the learning process. That is, in order for the neuromorphic array to efficiently execute the learning algorithm, it is important to determine conductances of elements in consideration of optimization of the entire system while pursuing the accuracy of conductances of individual elements. The present embodiment proposes execution of learning of the neuromorphic array while determining whether output of the entire system progresses in a desired direction by applying an input exceeding an amount of change calculated by the learning algorithm to a partially selected element such as an element having a maximum update amount. In addition, effects such as change with respect to the neural network system are obtained according to application of the additional write signal and, for example, an effect as a regularization term with respect to the system ending with a local optimal solution is also expected. In this case, deletion of determination processing after the additional write signal is applied in the above-described element adjustment step is also conceivable.

Meanwhile, in a case where the additional write signal is applied and thus learning error increases in the element adjustment step, when the increase exceeds a predetermined threshold value, control of applying a reverse write signal may be conceived. When learning error does not change, the element adjustment step is ended thereat and the process proceeds to the next learning cycle. For learning, the learning algorithm may be executed through batch processing according to a plurality of data units or in each individual learning data unit as in online learning.

Meanwhile, although a 1-class identifier has been described in the present embodiment, the present invention is applicable to a multi-class identifier. For example, in a case where a classifier for 10 handwritten digit images of 0 to 9 is realized, a structure in which 10 neuromorphic arrays 3 are arranged in parallel in the horizontal direction and each neuromorphic element 31 of each common bit line 32 is connected through a word line in the lateral direction is provided. In addition, outputs of 10 common bit lines 32 respectively correspond to 10 classes of 0 to 9, and learning is executed such that the output of a common bit line 32 having a highest likelihood becomes 1 and the outputs of other common bit lines 32 become 0 as results of identification processing. In such a case, it is possible to promote high speed of the learning algorithm and stabilization of convergence by sequentially executing the adjustment function of the present embodiment in units of common bit line in each step of learning.

Meanwhile, the present embodiment need not be limited to handwritten digits of the present example and can be applied to neural networks which perform identification and prediction on various types of information such as moving images, still images, sound, and time-series signals of a sensor and the like.

In the present embodiment, the neuromorphic array using elements with two terminals has been described. For example, elements such as an RERAM and a phase change memory are studied as such a 2-terminal type element. Meanwhile, the present embodiment may also be applied to a 3-terminal type element. In such a case, each neuromorphic element 31 includes 3 terminals: a read terminal; a write terminal; and a common terminal instead of the input terminal 311 and the common terminal 322, and the signal generation circuit applies a signal across the read terminal and the common terminal at the time of inference and applies a signal across the write terminal and the common terminal for conductance change at the time of learning. Meanwhile, as a 3-terminal type neuromorphic element, a magnetic wall movement type resistance change element using spintronics, or the like is studied.

Furthermore, although the write signal in the adjustment function step is described as a minimum pulse width of a write signal used at the time of conventional learning in the present embodiment, the write signal may be a signal corresponding to a plurality of units having the minimum pulse with as a unit, or a pulse width shorter than the minimum pulse width at the time of learning may be used.

As such a neuromorphic element, an arbitrary element may be used. In addition, as a neuromorphic element, for example, a combination of a plurality of neuromorphic elements of one type may be used or a combination of neuromorphic elements of two or more types may be used.

In the present embodiment, a neuromorphic element capable of changing a conductance value as an element characteristic is used, and resolution of the change is finite.

Meanwhile, as a neuromorphic element, an element capable of changing an arbitrary characteristic may be used and, for example, an element capable of changing a characteristic such as resistance, optical phase, or the like may be used.

The effects of the element adjustment function will be further described.

The results of FIG. 4 are based on the assumption of a case in which conductances of elements have stochastic variations in 3-layer MLP, as described above. That is, the results represent the influence on learning algorithm convergence when a conductance rewriting result has an error of a stochastic distribution in processing of each conductance change in the learning step. Here, it is ascertained that the learning algorithm does not operate due to stochastic variation, the output of the loss function increases in accordance with progress of learning, and the identification rate decreases to less than 40%. It is ascertained that repeatability error of elements has an adverse influence on the learning algorithm.

Figure 8:
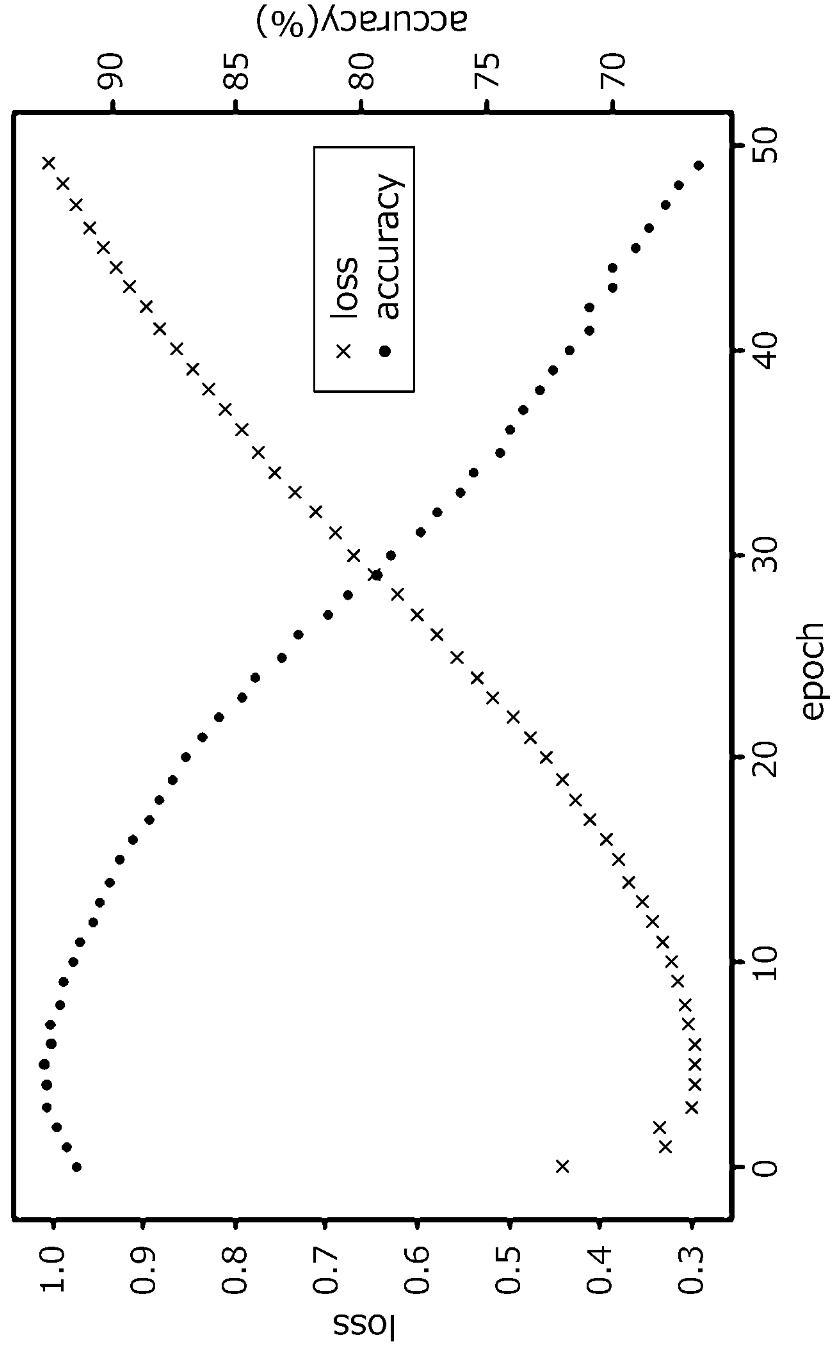
FIG. 8 is a diagram illustrating simulation results representing the output of a loss function and transition of change in identification performance in accordance with progress of learning in a case where variation in elements has been added to discrete characteristics of the elements and an adjustment function has been applied to 5% of all elements.
Figure 9:
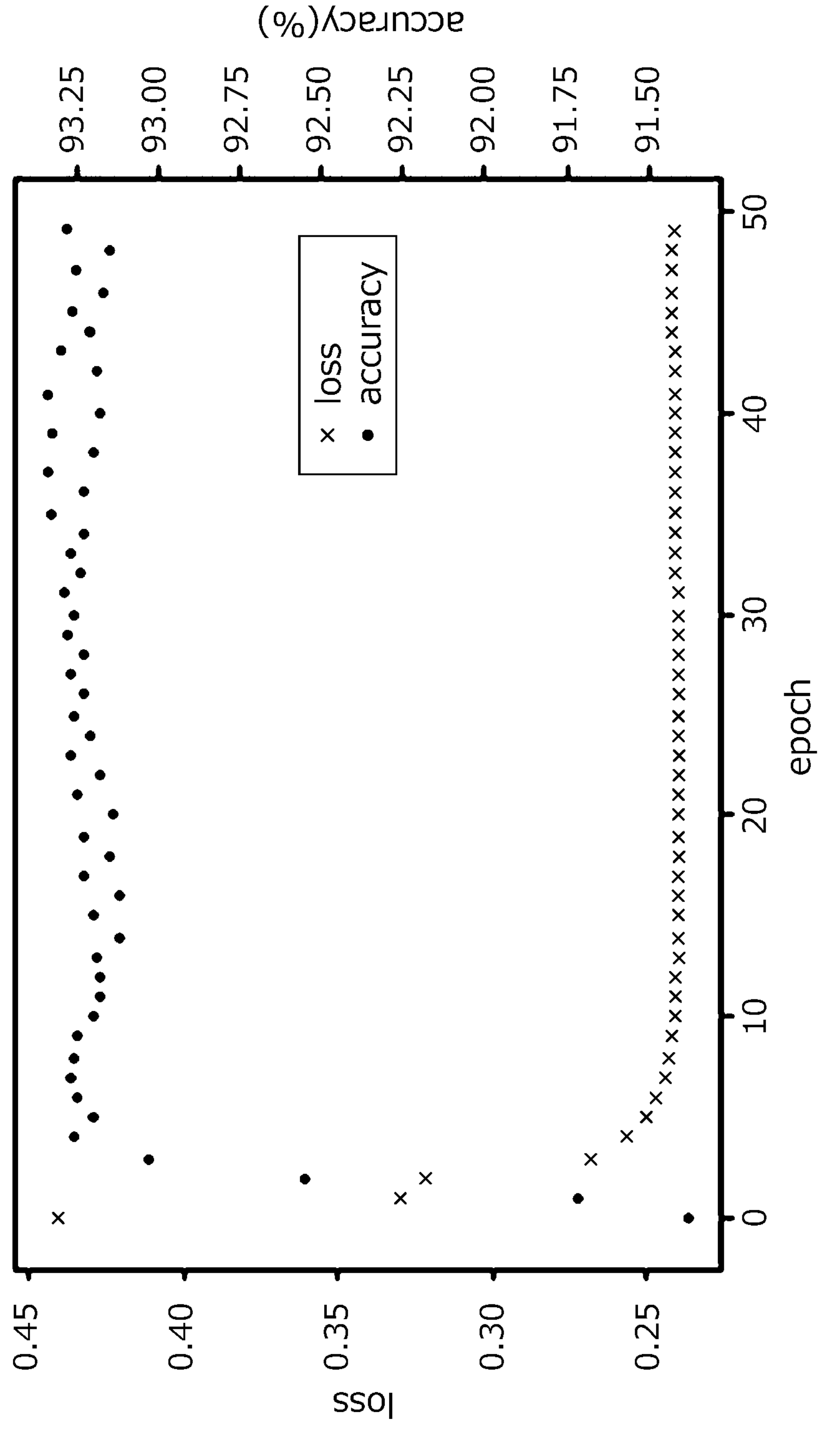
FIG. 9 is a diagram illustrating simulation results representing the output of a loss function and transition of change in identification performance in accordance with progress of learning in a case where variation in elements has been added to discrete characteristics of the elements and an adjustment function has been applied to 8% of all elements.
Figure 10:
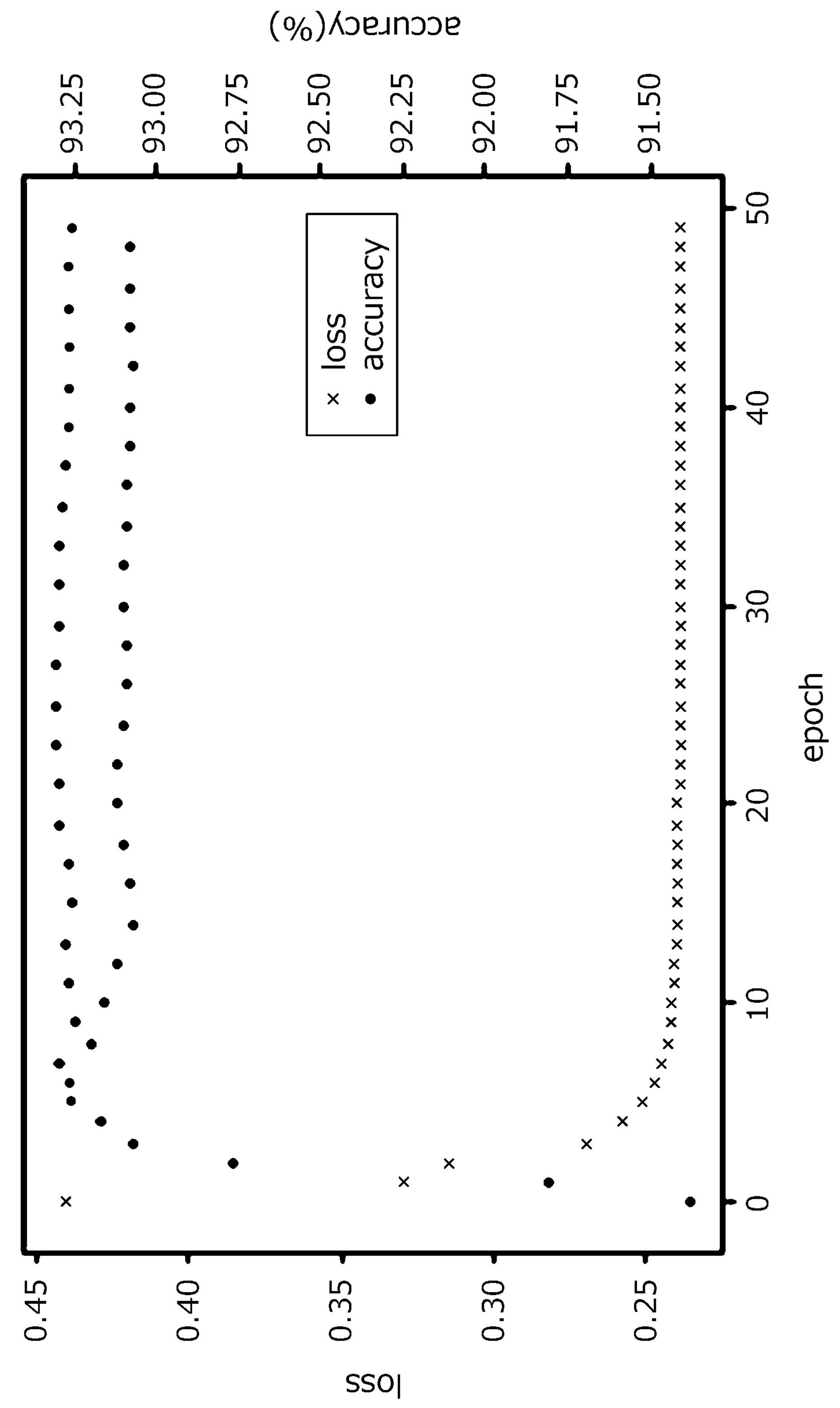
FIG. 10 is a diagram illustrating simulation results representing the output of a loss function and transition of change in identification performance in accordance with progress of learning in a case where variation in elements has been added to discrete characteristics of the elements and an adjustment function has been applied to 10% of all elements.

Accordingly, processing corresponding to the adjustment function is performed on certain neuromorphic elements 31 based on the present invention. Results obtained by executing a learning algorithm including processing of returning to positive discrete values after conductance variation is applied to neuromorphic elements 31 corresponding to 5%, 8%, and 10% in order of sizes of absolute values of weight update amounts for each learning process are shown in FIG. 8, FIG. 9, and FIG. 10. Although the adjustment function of the present invention does not necessarily return conductances of elements to positive values, it is conceived that the effects of additional writing for certain elements and the operation of evaluating a difference between the output of the neuromorphic array and teacher data and determining transition of learning again in the adjustment function are indirectly represented. In an adjustment mechanism for 5%, the identification rate itself is slightly improved, but the influence on the algorithm cannot be avoided and the output of the loss function tends to decrease as in a case in which repeatability variation has been mixed. However, when the same adjustment mechanism is applied to elements of 8%, the learning algorithm itself normally operates in addition to improvement of identification performance. That is, it is possible to prevent failure of the learning algorithm by incorporating the adjustment function of the present invention for elements of about 8% of 784×100 elements of the first layer. Further, the same result is represented for elements of 10%. Meanwhile, although it is represented that the effects are obtained by incorporating the adjustment function for the elements of 8% here, this depends on definitions and structures of a learning algorithm, a learning rate update method called an optimizer, or the like, and a network.

Summary of Embodiment

As described above, in the neural network system 1 according to the present embodiment, the element adjustment mechanism in a case of learning a neural network using a neuromorphic array using neuromorphic elements having a finite resolution has been disclosed. That is, after processing of updating conductances of elements based on weight update amounts calculated on the basis of a learning algorithm such as the conventional gradient descent method, certain elements constituting the element array are re-selected and a write signal is additionally applied to the elements, and then a difference between an output result obtained by inputting learning data and a teacher signal is evaluated to improve learning performance. As a method of selecting elements in such additional optimization processing, a method of simply selectively adjusting elements having high ratios of the number of elements to all elements, update amount absolute values, and conductance update amount (absolute values), and the like has been disclosed. In addition, in this selection, even if elements of about 8% of all elements are selected, the influence of change in element characteristics on the learning algorithm can be sufficiently curved and convergence of the learning algorithm can be improved.

In general, weights are changed such that the absolute values thereof gradually increase in accordance with progress of the learning algorithm in a neural network. Accordingly, values of elements having large update amounts increase and the activity of connection thereof increases, and thus it is rational to incorporate the adjustment function for such a connection part. In addition, as can be ascertained from expressions (1) to (5), in the error back propagation method, it is possible to incorporate a mechanism for selecting elements having large input signal values of learning data instead of weight update amounts or conductance update amounts into the element adjustment mechanism because a weight update amount is proportional to the absolute value of an input signal.

In addition, the present embodiment is also effective in a case where a multi-layer neural network is realized by a plurality of neuromorphic arrays. In a multi-layer neural network, a weight update amount is calculated in units of layer through learning using the error back propagation method or the like from a layer close to an output stage. At this time, optimization of conductances of the neuromorphic arrays may also be performed during the learning algorithm of each array in the same manner.

For example, in the case of a 3-layer structure, that is, a structure having a hidden layer, a neural network is realized by a first neuromorphic array between an input layer and the hidden layer and a second neuromorphic array between the hidden layer and an output layer. In this case, a weight update amount is calculated from differences between outputs of the neuromorphic arrays and a teacher signal using the gradient descent method or the like and an amount of change in conductance of each element of the second neuromorphic array is calculated through learning. A write signal for causing the obtained amount of change is applied to element arrays to change the conductance of each element. Conductance change of the first neuromorphic array is calculated using a process of calculating weight update amounts of the second neuromorphic array. This calculation process can be retroactively applied to any layer using a method called error back propagation.

Here, although handwritten image data of digits is used as a target (identification target) identified by the neural network in the present embodiment, the identification target is not limited and data such as sound and sensor signals may be used. In addition, although the object has been described using an example of identifying a written digit from handwritten image data, the present embodiment is also applicable to identification of a character from a sound signal, prediction of an audio signal, functions of detecting and identifying an object from moving image data, semantic segmentation for predicting a class in units of pixel, and the like.

Furthermore, as a neural network, arbitrary type of neural network may be used and, for example, a fully connected neural network, a convolution neural network, a recursive neural network, or the like may be used.

Meanwhile, a program for realizing the function of each device (e.g., a control device 11) according to the above-described embodiment may be recorded in a computer-readable recording medium (storage medium) and processing may be performed by a computer system reading and executing the program recorded in the recording medium.

Meanwhile, the "computer system" mentioned here may include an operating system (OS) or hardware such as peripheral devices.

In addition, the "computer-readable recording medium" refers to writable nonvolatile memories such as a flexible disk, a magneto-optical disk, a read only memory (ROM) and a flash memory, a portable medium such as a digital versatile disc (DVD), or a storage device such as a hard disk embedded in a computer system. Further, recording media may be, for example, recording media that temporarily record data.

Furthermore, the "computer-readable recording medium" may also include a recording medium that holds a program for a specific time, such as a volatile memory (e.g., a dynamic random access memory (DRAM)) in a computer system serving as a server or a client in a case where the program is transmitted through a network such as the Internet or a communication circuit such as a telephone circuit.

In addition, the aforementioned program may be transmitted from a computer system in which this program is stored in a storage device or the like to another computer system through a transmission medium or according to transmitted waves in the transmission medium. Here, the "transmission medium" that carries the program refers to a medium having a function of transmitting information, such as a network (communication network) such as the Internet or a communication circuit (communication line) such as a telephone circuit.

In addition, the aforementioned program may be a program for realizing some of the above-described functions. Further, the aforementioned program may be a program which can realize the above-described functions according to a combination with a program already recorded in a computer system, a so-called a difference file (difference program).

Configuration Examples

As a configuration example, a control device (the learning control circuit 6 in the present embodiment) of an array (the neuromorphic array 3 in the present embodiment) including neuromorphic elements that multiply a signal by a weight corresponding to a value of a variable characteristic (e.g., conductance or the like) includes a control unit (the function of the learning control circuit 6 and, for example, the additional write signal generation unit 66 in the present embodiment) which adjusts conductances while additionally varying certain elements extracted under specific conditions in a function of performing learning of neuromorphic elements by changing conductances of the neuromorphic elements converted from weight update amounts output from a learning algorithm.

As a configuration example, in the control device, the control unit selects a target element having a maximum input value of learning data.

As a configuration example, in the control device, the control unit selects an element corresponding to a weight corresponding to a maximum weight update amount among weight update amounts calculated through the learning algorithm.

As a configuration example, in the control device, the control unit selects an element having a maximum amount of change in conductance.

As a configuration example, in the control device, the control unit selects a plurality of target elements using a threshold value set on the basis of any of the aforementioned criteria and sequentially executes the above-described adjustment function on the elements.

As a configuration example, in the control device, the control unit has a function of updating the threshold value for each progress of learning.

As a configuration example, in the control device, the control unit has a function of setting different threshold values for layers of a neural network.

As a configuration example, in the control device, the control unit has a function of continuing an additional pulse applying step while a difference between a result obtained by inputting learning data and a teacher signal decreases after execution of the aforementioned adjustment function.

As a configuration example, in the control device, the control unit (the function of the learning control circuit 6, for example, the learning determination unit 63, the conductance update amount calculation unit 64, and the write signal generation unit 65 in the present embodiment) performs learning with respect to the array using a neuromorphic element discretization step size.

As a configuration example, in the control device, the array includes a circuit that performs a product-sum operation in a neural network using neuromorphic elements.

As a configuration example, an operation method (e.g., an operation method performed by the conductance update amount calculation unit 64 of the learning control circuit 6 or another computer) for operating a learning algorithm on the basis of a discretization step size of characteristics of neuromorphic elements with respect to an array including the neuromorphic elements that multiply a signal by a weight corresponding to a value of a variable characteristic includes: a step of performing learning of a neural network with an accuracy higher than a resolution of the characteristics of the neuromorphic elements; a step of converting a weight update amount into a conductance update amount of each element of the neuromorphic array; a step of applying a write signal based on the converted conductance update amount to the neuromorphic array; a step of selecting an element having a maximum update amount; a step of applying an additional write signal only to the selected element; and a step of re-inputting learning data to the neuromorphic array and determining end of the corresponding learning cycle using a difference from a teacher signal of the learning data.

As a configuration example, a program for causing a computer to execute an operation method (e.g., an operation method performed by the conductance update amount calculation unit 64 of the learning control circuit 6 or another computer) for operating a learning algorithm on the basis of a discretization step size of characteristics of neuromorphic elements with respect to an array including the neuromorphic elements that multiply a signal by a weight corresponding to a value of a variable characteristic, including: a step of performing learning of a neural network with an accuracy higher than a resolution of the characteristics of the neuromorphic elements; a step of converting a weight update amount into a conductance update amount of each element of the neuromorphic array; a step of applying a write signal based on the converted conductance update amount to the neuromorphic array; a step of selecting an element having a maximum update amount; a step of applying an additional write signal only to the selected element; and a step of re-inputting learning data to the neuromorphic array and determining end of the corresponding learning cycle using a difference from a teacher signal of the learning data.

Here, in the computer, for example, a processor such as a central processing unit (CPU) reads a program stored in a memory and executes the program.

Although the embodiment of the present invention has been described in detail with reference to the drawings, a specific configuration is not limited to this embodiment and includes design change without departing from essential characteristics of the present invention.

INDUSTRIAL APPLICABILITY

According to the present invention, it is possible to stably execute a learning algorithm calculated through a computer in a case where learning of a neural network system is performed using a neuromorphic array.

In addition, according to the present invention, it is possible to cause a learning algorithm to rapidly converge in a neural network using a neuromorphic array.

Furthermore, according to the present invention, it is possible to improve identification performance in a neural network using a neuromorphic array.

REFERENCE SIGNS LIST

1: Neural network system
2: Signal generation circuit
3: Neuromorphic array
31: Neuromorphic element
311: Input terminal
312: Common terminal
32: Common bit line
33: Word line
4: Detection circuit
5: Differential circuit
6: Learning control circuit
61: Learning signal generation unit
62: Teacher signal generation unit
63: Learning determination unit
64: Conductance update amount calculation unit
65: Write signal generation unit
66: Additional write signal generation unit
Pic No. 0 to 24: Image

The invention claimed is:

1. A neuromorphic circuit having two or more variable resistance elements capable of having variable resistance values and connected to a common bit line, the neuromorphic circuit comprising:

an input signal generation circuit configured to generate an input signal from input data and apply the input signal to the variable resistance elements;

a detection circuit configured to detect a current flowing through the common bit line;

a differential circuit configured to output a difference between a teacher signal corresponding to the input data and an output of the detection circuit;

a learning control circuit configured to execute a learning algorithm of a neural network and convert a weight update amount into an amount of change in conductance of each of the variable resistance elements;

a write signal generation circuit configured to generate a full write signal for changing conductances of the variable resistance elements by the amount of change in conductance calculated by the learning control circuit, the full write signal being applied to all of the variable resistance elements in a single operation without performing any read or verify operation of conductances of any of the variable resistance elements before or during application of the full write signal;

a selection circuit configured to select a chosen variable resistance element among the variable resistance elements exclusively based on selection conditions derived from the learning algorithm and without using any readout of device conductance for the selection, the selection conditions including at least one of (i) an absolute value of a weight update amount and (ii) an absolute value of the input data, aggregated over a batch of training samples, and to perform the selection after applying the full write signal to all variable resistance elements;

an additional write signal generation circuit configured to generate an additional write signal for the chosen variable resistance element and apply the additional write signal only to the chosen variable resistance element without performing any read or verify of a conductance of the chosen variable resistance element before application of the additional write signal, the full write and the additional write being realized by pulses of fixed width with finite resolution; and a determination circuit configured to re-input the input signal to all variable resistance elements only after applying the full write signal to all variable resistance elements and the additional write signal to the chosen variable resistance element and determine whether to continue or stop learning based on change in the difference between the output of the detection circuit and the teacher signal, including that learning is terminated when the magnitude of the change remains below a threshold for a plurality of consecutive re-inputs and/or when a loss is monotonically decreased for a plurality of consecutive re-inputs.

2. The neuromorphic circuit according to claim 1, wherein the selection conditions in the selection circuit include selection according to a threshold value calculated on a basis of absolute values of weight update amounts.

3. The neuromorphic circuit according to claim 2, wherein the threshold value is determined such that elements are selected at a fixed ratio with respect to a total number of elements connected to the common bit line.

4. The neuromorphic circuit according to claim 3, wherein two or more common bit lines disposed in a first direction are provided, a plurality of variable resistance elements disposed at a same positions on the plurality of common bit lines from an edge are connected through word lines arranged in a second direction different from the direction of the common bit lines, and the selection circuit is configured to sequentially perform additional write signal applying processing for the respective common bit lines.

5. The neuromorphic circuit according to claim 2, wherein the threshold value is changed in accordance with progress of learning.

6. The neuromorphic circuit according to claim 5, wherein two or more common bit lines disposed in a first direction are provided, a plurality of variable resistance elements disposed at a same positions on the plurality of common bit lines from an edge are connected through word lines arranged in a second direction different from the direction of the common bit lines, and the selection circuit is configured to sequentially perform additional write signal applying processing for the respective common bit lines.

7. The neuromorphic circuit according to claim 2, wherein two or more common bit lines disposed in a first direction are provided, a plurality of variable resistance elements disposed at a same positions on the plurality of common bit lines from an edge are connected through word lines arranged in a second direction different from the direction of the common bit lines, and the selection circuit is configured to sequentially perform additional write signal applying processing for the respective common bit lines.

8. The neuromorphic circuit according to claim 1, wherein the selection conditions in the selection circuit include selection according to a threshold value calculated on a basis of an absolute value of the input data.

9. The neuromorphic circuit according to claim 8, wherein the threshold value is determined such that elements are selected at a fixed ratio with respect to a total number of elements connected to the common bit line.

10. The neuromorphic circuit according to claim 9, wherein two or more common bit lines disposed in a first direction are provided, a plurality of variable resistance elements disposed at a same positions on the plurality of common bit lines from an edge are connected through word lines arranged in a second direction different from the direction of the common bit lines, and the selection circuit is configured to sequentially perform additional write signal applying processing for the respective common bit lines.

11. The neuromorphic circuit according to claim 8, wherein the threshold value is changed in accordance with progress of learning.

12. The neuromorphic circuit according to claim 11, wherein two or more common bit lines disposed in a first direction are provided, a plurality of variable resistance elements disposed at a same positions on the plurality of common bit lines from an edge are connected through word lines arranged in a second direction different from the direction of the common bit lines, and the selection circuit is configured to sequentially perform additional write signal applying processing for the respective common bit lines.

13. The neuromorphic circuit according to claim 8, wherein two or more common bit lines disposed in a first direction are provided, a plurality of variable resistance elements disposed at a same positions on the plurality of common bit lines from an edge are connected through word lines arranged in a second direction different from the direction of the common bit lines, and the selection circuit is configured to sequentially perform additional write signal applying processing for the respective common bit lines.

14. The neuromorphic circuit according to claim 1, wherein two or more common bit lines disposed in a first direction are provided, a plurality of variable resistance elements disposed at a same positions on the plurality of common bit lines from an edge are connected through word lines arranged in a second direction different from the direction of the common bit lines, and the selection circuit is configured to sequentially perform additional write signal applying processing for the respective common bit lines.

15. The neuromorphic circuit according to claim 14, wherein the threshold value is set differently for the common bit lines.

16. The neuromorphic circuit according to claim 1, wherein after applying the additional write signal, the determination mechanism is configured to further apply an additional write signal if a difference change amount is positive; and further apply a write signal for changing resistance in a reverse direction if the difference change amount is negative.

17. A neuromorphic array learning method, in a neuromorphic array composed of a plurality of variable resistance elements, comprising the steps of:

performing learning of a neural network;

converting a weight update amount of the neural network into an amount of change in conductance of each variable resistance element of the neuromorphic array;

applying a full write signal based on the converted amount of change in conductance to the neuromorphic array in a single operation without performing any read or verify operation of conductances of any of the variable resistance elements before or during application of the full write signal;

selecting a portion of the elements exclusively based on selection conditions derived from the learning algorithm and without using any readout of device conductance for the selection, the selection conditions including at least one of (i) an absolute value of a weight update amount and (ii) an absolute value of the input data, aggregated over a batch of training samples, and to perform the selection after applying the full write signal to all variable resistance elements;

applying an additional write signal only to the selected elements without performing any read or verify of a conductance of the chosen variable resistance element before application of the additional write signal, the full write and the additional write being realized by pulses of fixed width with finite resolution; and re-inputting learning data to the neuromorphic array without performing any read or verify of a conductance of the chosen variable resistance element before the additional write, the full write and the additional write being realized by pulses of fixed width and/or fixed amplitude with quantized step resolution and determining end of a corresponding learning cycle using a difference from a teacher signal of the learning data when the magnitude of the change remains below a threshold for a plurality of consecutive re-inputs and/or when a loss is monotonically decreased for a plurality of consecutive re-inputs.

18. A non-transitory computer readable medium storing a program for causing a computer to execute, in a neuromorphic array including neuromorphic elements that multiply a signal by a weight corresponding to a variable characteristic, the steps of:

performing learning of a neural network;

converting a weight update amount of the neural network into an amount of change in conductance of a neuromorphic array element;

applying a full write signal based on the converted amount of change in conductance to the neuromorphic array in a single operation without performing any read or verify operation of conductances of any of the variable resistance elements before or during application of the full write signal;

selecting a variable resistance element among the variable resistance elements exclusively based on selection conditions derived from the learning algorithm and without using any readout of device conductance for the selection, the selection conditions including at least one of (i) an absolute value of a weight update amount and (ii) an absolute value of the input data, aggregated over a batch of training samples, and to perform the selection after applying the full write signal to all variable resistance elements after applying the wire signal to all variable resistance elements;

applying an additional write signal only to the selected elements without performing any read or verify of a conductance of the chosen variable resistance element before application of the additional write signal, the full write and the additional write being realized by pulses of fixed width and/or fixed amplitude with quantized step resolution; and re-inputting learning data to all variable resistance elements without performing any read or verify of a conductance of the chosen variable resistance element before the additional write, the full write and the additional write being realized by pulses of fixed width with finite resolution after applying the full write signal to the all variable resistance elements and the additional write signal to the selected variable resistance elements and determining end of a corresponding learning cycle using a difference from a teacher signal of the learning data when the magnitude of the change remains below a threshold for a plurality of consecutive re-inputs and/or when a loss is monotonically decreased for a plurality of consecutive re-inputs.

* * * * *